(12) United States Patent
Oikawa et al.

(10) Patent No.: US 11,651,833 B2
(45) Date of Patent: May 16, 2023

(54) ERROR DETECTION IN MEMORY SYSTEM

(71) Applicant: KIOXIA CORPORATION, Tokyo (JP)

(72) Inventors: Kohei Oikawa, Kawasaki Kanagawa (JP); Keiri Nakanishi, Kawasaki Kanagawa (JP); Sho Kodama, Kawasaki Kanagawa (JP); Masato Sumiyoshi, Yokohama Kanagawa (JP); Daisuke Yashima, Tachikawa Tokyo (JP); Youhei Fukazawa, Kawasaki Kanagawa (JP); Zheye Wang, Kawasaki Kanagawa (JP); Takashi Miura, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/680,128

(22) Filed: Feb. 24, 2022

(65) Prior Publication Data

US 2023/0087517 A1    Mar. 23, 2023

(30) Foreign Application Priority Data

Sep. 17, 2021 (JP) .............................. JP2021-152617

(51) Int. Cl.
*G11C 29/42* (2006.01)
*H03M 13/00* (2006.01)
*H03M 13/09* (2006.01)

(52) U.S. Cl.
CPC ........... *G11C 29/42* (2013.01); *H03M 13/091* (2013.01); *H03M 13/611* (2013.01)

(58) Field of Classification Search
CPC .... G11C 29/42; H03M 13/091; H03M 13/611
See application file for complete search history.

(56) References Cited

U.S. PATENT DOCUMENTS

| | | | |
|---|---|---|---|
| 7,577,899 B2 | 8/2009 | Nieto et al. | |
| 8,145,868 B2 | 3/2012 | Coteus et al. | |
| 8,151,042 B2 | 4/2012 | Coteus et al. | |
| 8,495,328 B2 | 7/2013 | Coteus et al. | |
| 2006/0053361 A1* | 3/2006 | Kim ...................... | G11C 29/42 714/766 |
| 2007/0286078 A1 | 12/2007 | Coteus et al. | |

(Continued)

*Primary Examiner* — Steve N Nguyen
(74) *Attorney, Agent, or Firm* — Kim & Stewart LLP

(57) ABSTRACT

A memory system includes a non-volatile memory and a controller. The controller is configured to, during a writing operation, generate a first error-detecting code from data that is input, perform a predetermined conversion on the data into first conversion data, generate a second error-detecting code from the first conversion data, and store the data, the first error-detecting code, and the second-error detecting code in the non-volatile memory. The controller is configured to during a read operation, read the data, the first error-detecting code, and the second error-detecting code from the non-volatile memory, perform a first error detection on the data using the first error-detecting code, perform the predetermined conversion on the data into second conversion data, perform a second error detection on the second conversion data using the second error-detecting code, and output the second conversion data based on results of the first and second error detections.

20 Claims, 12 Drawing Sheets

(56) References Cited

U.S. PATENT DOCUMENTS

| | | |
|---|---|---|
| 2007/0286199 A1 | 12/2007 | Coteus et al. |
| 2011/0182119 A1* | 7/2011 | Strasser ............... G11C 29/021 |
| | | 365/185.24 |
| 2012/0151172 A1 | 6/2012 | Coteus et al. |
| 2014/0095958 A1* | 4/2014 | Kwok ................. H03M 13/159 |
| | | 714/758 |
| 2016/0085622 A1* | 3/2016 | Andre ................... H04L 1/0045 |
| | | 714/764 |
| 2020/0025825 A1 | 1/2020 | Azam et al. |
| 2020/0042230 A1* | 2/2020 | Li ....................... G06F 11/1012 |
| 2020/0201711 A1* | 6/2020 | Kim ....................... G06F 21/78 |
| 2022/0148670 A1* | 5/2022 | Lee ......................... G11C 29/18 |
| 2022/0207190 A1* | 6/2022 | Chhabra ............... H04W 12/10 |

* cited by examiner

ERROR DETECTION IN MEMORY SYSTEM

CROSS-REFERENCE TO RELATED APPLICATION

This application is based upon and claims the benefit of priority from Japanese Patent Application No. 2021-152617, filed Sep. 17, 2021, the entire contents of which are incorporated herein by reference.

FIELD

Embodiments described herein relate generally to a memory system.

BACKGROUND

In a memory system, cyclic redundancy check (CRC) of input data is calculated before storing the data. When the stored data is output, the correctness of the stored data is checked using the CRC.

DETAILED DESCRIPTION

One embodiment aims to provide a memory system capable of checking whether or not stored data is without errors even when it is converted and output.

Embodiments provide a memory system that includes a non-volatile memory and a controller. The controller is configured to, during a writing operation, generate a first error detecting code from data that is input, perform a predetermined conversion on the data into first conversion data, generate a second error detecting code from the first conversion data, and store the data, the first error detecting code, and the second error detecting code in the non-volatile memory in association with each other The controller is configured to during a read operation, read the data, the first error detecting code, and the second error detecting code from the non-volatile memory, perform a first error detection on the read data using the read first error detecting code, perform the predetermined conversion on the read data into second conversion data, perform a second error detection on the second conversion data using the read second error detecting code, and output the second conversion data based on results of the first and second error detections.

The memory system according to embodiments will be described in detail with reference to the accompanying drawings below. The present disclosure is not limited to these embodiments.

First Embodiment

Example of Configuration of Memory System

Figure 1:
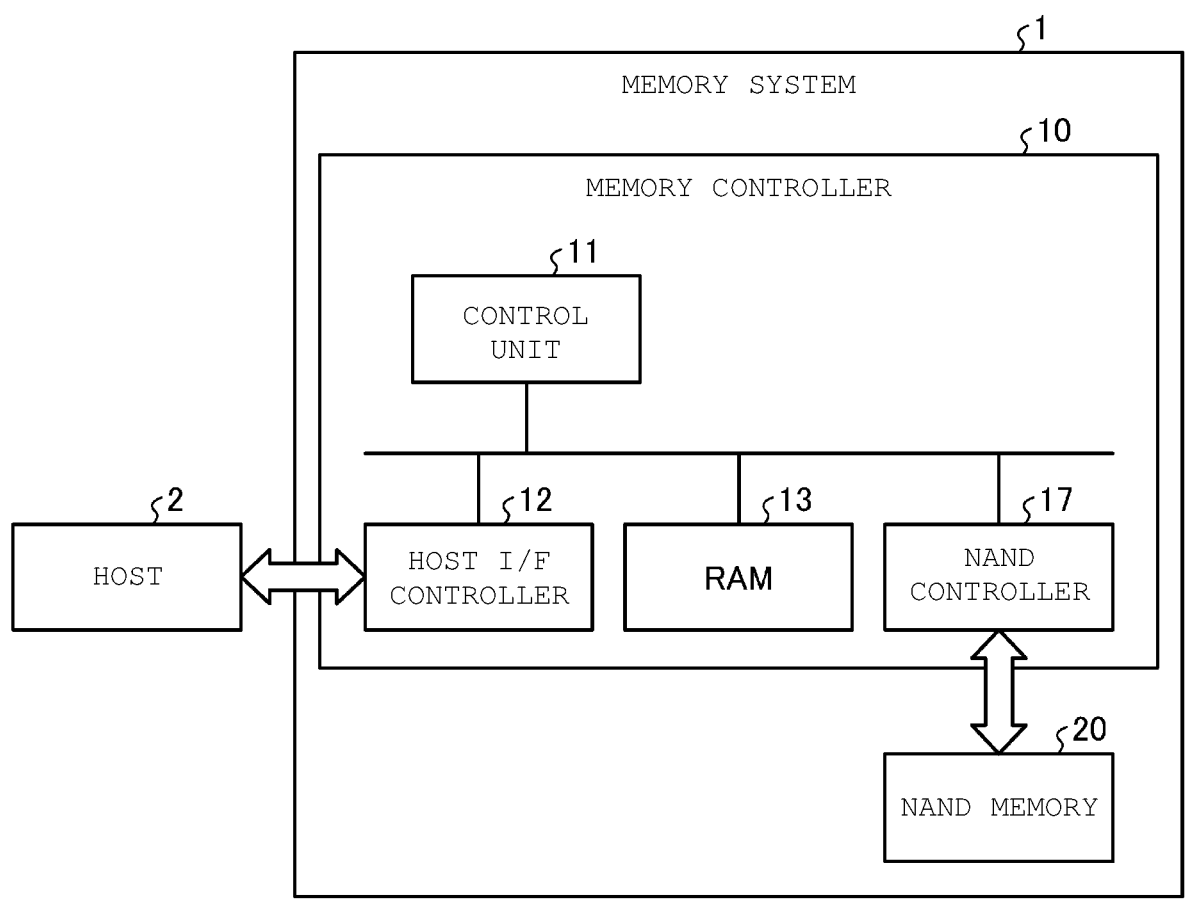
FIG. 1 is a diagram illustrating an example of a memory system according to a first embodiment.

FIG. 1 is a diagram illustrating an example of a memory system 1 according to a first embodiment. As illustrated in FIG. 1, the memory system 1 includes a memory controller 10 and a NAND flash memory 20 (hereinafter, referred to as "NAND memory 20").

The memory controller 10 may be configured as, for example, a system on a chip (SoC). Further, the memory controller 10 may include a field programmable gate array (FPGA) or an application specific integrated circuit (ASIC). The memory controller 10 can instruct the NAND memory 20 to perform various operations. The memory controller 10 executes an operation based on a request from an external host 2 and also executes an operation that is not based on a request from the host 2. Each function of the memory controller 10 may be implemented by a central processing unit (CPU) that executes a program, dedicated hardware, or a combination thereof.

The memory controller 10 includes a control unit 11, a host interface (I/F) controller 12, a random access memory (RAM) 13, and a NAND controller 17.

The control unit 11 is a circuit that controls the operation of the entire memory controller 10. The control unit 11 issues a write command in response to a write request received from the host 2, and transmits the issued write command to the NAND controller 17. Further, the control unit 11 issues a read command in response to, for example, a read request received from the host 2, and transmits the issued read command to the NAND controller 17. Further, the control unit 11 converts stored data that is read and outputs the converted data to the host 2 or the like.

The control unit 11 generates a CRC for input data, associates the CRC with the input data, and stores the input data and the CRC in the NAND memory 20 via the NAND controller 17. Here, the input data is, for example, data specified by a write request from the host 2. When outputting the stored data, the control unit 11 inspects the stored data based on the CRC.

The host I/F controller 12 is coupled to the host 2 and controls communication between the memory system 1 and the host 2. The host I/F controller 12 controls transfer of data, requests, and addresses, for example, between the memory system 1 and the host 2. The host I/F controller 12 performs processing according to a communication interface standard for communication with the host 2. The host I/F controller 12 receives one or more signals indicating an access destination address and a command from the host 2.

The RAM 13 is a memory used as a work area of the control unit 11. The RAM 13 stores, for example, parameters for managing the NAND memory 20, various management tables, and the like. The RAM 13 stores, for example, a queue (command queue) of requests received from the host 2. Further, the RAM 13 stores an address conversion table for converting a logical address associated with the data stored in the NAND memory 20 into a physical address of the NAND memory 20. This address conversion table is stored in, for example, the NAND memory 20, read out when the memory system 1 is started, and stored in the RAM 13. As the RAM 13, a volatile memory such as static random access memory (SRAM) is used.

The NAND controller 17 is an interface device for accessing the NAND memory 20. The NAND controller 17 executes transfer of information including user data to and from the NAND memory 20 under control of the control unit 11. The NAND memory 20 is a non-volatile storage medium. The NAND memory 20 may include one or more chips.

As described above, the memory system 1 generates a CRC for the input data, stores the input data, and inspects the stored data based on the CRC. As a result, it is possible to detect a failure in the entire internal data path from the data input to the output in the memory system 1.

By the way, instead of outputting the data stored in the NAND memory 20 as it is, the stored data may be converted and then output. In this case, it is not possible to detect a failure in a circuit that converts the data. To address such an issue, the memory system 1 according to the first embodiment detects a failure in the conversion function even when the stored data is converted and then output.

Figure 2:
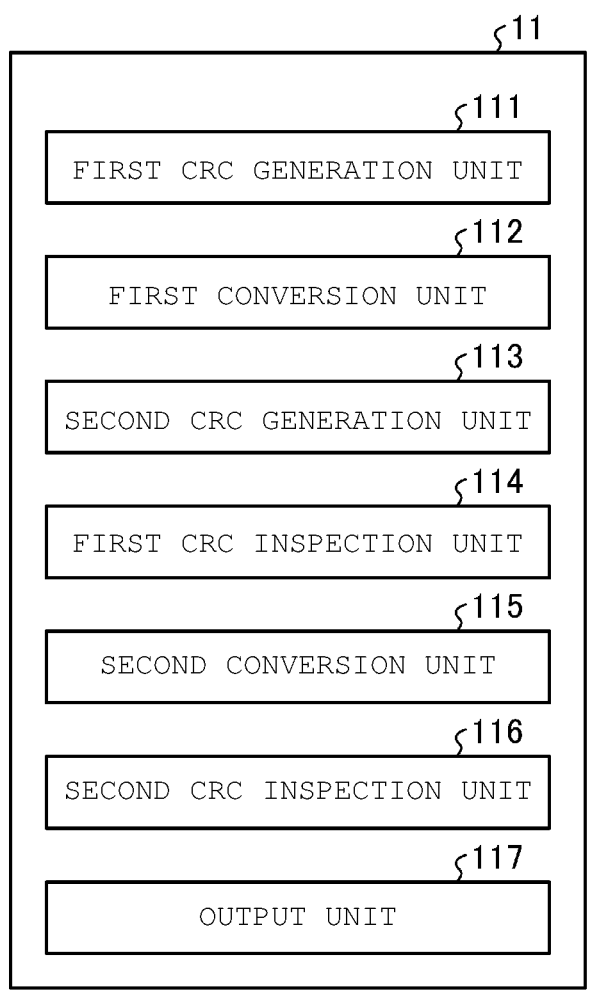
FIG. 2 is a block diagram illustrating an example of a functional configuration of a control unit in the memory system according to the first embodiment.

FIG. 2 is a block diagram illustrating an example of the functional configuration of the control unit 11 in the memory system 1 according to the first embodiment. As illustrated in FIG. 2, the control unit 11 includes a first CRC generation unit 111, a first conversion unit 112, a second CRC generation unit 113, a first CRC inspection unit 114, a second conversion unit 115, a second CRC inspection unit 116, and an output unit 117.

The first CRC generation unit 111 is a circuit that calculates a CRC1, which is a CRC based on input data. The CRC1 is an example of first inspection data.

The first conversion unit 112 is a circuit that performs processing of converting the input data. For example, the first conversion unit 112 executes compression, compression format conversion, or encryption on the input data to generate the converted data.

The second CRC generation unit 113 is a circuit that calculates a CRC2 which is a CRC based on the data converted by the first conversion unit 112. The CRC2 is an example of second inspection data.

The input data, the CRC1, and the CRC2 are associated and stored in the NAND memory 20. As a result, when the memory system 1 converts the stored data and outputs the converted data, failures that occur in the circuit that executes conversion processing can be checked by inspecting the converted data by using the CRC2. The input data converted by the first conversion unit 112 is not stored in the NAND memory 20.

The first CRC inspection unit 114 is a circuit that inspects the stored data based on the CRC1. The inspection executed by the first CRC inspection unit 114 is an example of a first inspection.

The second conversion unit 115 is a circuit that executes conversion processing substantially same or similar to the conversion processing executed by the first conversion unit 112 on the stored data read from the NAND memory 20. The second conversion unit 115 is implemented by a circuit different from that of the first conversion unit 112.

The second CRC inspection unit 116 is a circuit that inspects the data read from the NAND memory 20 and converted by the second conversion unit 115 based on CRC2. The inspection executed by the second CRC inspection unit 116 is an example of a second inspection.

The output unit 117 is a circuit that outputs the data converted by the second conversion unit 115 based on an inspection result by the first CRC inspection unit 114 and an inspection result by the second CRC inspection unit 116. For example, the output unit 117 outputs the data converted by the second conversion unit 115 when the inspection result by the first CRC inspection unit 114 and the inspection result by the second CRC inspection unit 116 do not indicate an error. Further, when at least one of the inspection result by the first CRC inspection unit 114 and the inspection result by the second CRC inspection unit 116 indicates an error, the output unit 117 notifies the error without outputting the data converted by the second conversion unit 115.

When outputting the data read from the NAND memory 20 without being converted by the second conversion unit 115, the output unit 117 outputs the data based on the inspection result by the first CRC inspection unit 114. For example, when the inspection result by the first CRC inspection unit 114 does not indicate an error, the output unit 117 outputs the data stored in the NAND memory 20. Further, when the inspection result by the first CRC inspection unit 114 indicates an error, the output unit 117 notifies the error without outputting the data stored in the NAND memory 20.

Subsequently, the write processing and the read processing executed by the memory system 1 will be described with reference to the functional configuration of the memory system 1 illustrated in FIG. 3. The write processing and the read processing will be described separately. First, the write processing will be described. The first CRC generation unit 111 calculates the CRC1 based on input data. Here, the input data is, for example, data specified by a write request from the host 2. Then, the input data is sent to the first conversion unit 112, the first conversion unit 112 converts the input data, and the second CRC generation unit 113 calculates the CRC2 based on the converted input data. Then, corresponding data 200 in which the input data (i.e., stored data), the CRC1, and the CRC2 are associated with each other is stored in the NAND memory 20. The above is the description of the write processing.

Next, the read processing will be described. When a read request is received from the host 2, if converted data is requested by the read request, the second conversion unit 115 acquires the stored data and the CRC2 of the corresponding data 200 read from the NAND memory 20, converts the stored data, and inputs the converted data and the CRC2 to the second CRC inspection unit 116. The second CRC inspection unit 116 inspects the converted data based on the CRC2. Then, the second CRC inspection unit 116 inputs an inspection result and the converted data to the output unit 117. Further, the first CRC inspection unit 114 acquires the stored data and the CRC 1 of the corresponding data 200, inspects the stored data of the corresponding data 200 based on and the CRC1, and inputs an inspection result to the output unit 117. The output unit 117 outputs the converted data based on the inspection result by the first CRC inspection unit 114 and the inspection result by the second CRC inspection unit 116.

When converted data is not requested by the read request, the first CRC inspection unit 114 acquires the stored data and the CRC1 of the corresponding data 200, inspects the stored data of the corresponding data 200 based on the CRC1, and inputs an inspection result and the stored data of the corresponding data 200 to the output unit 117. The output unit 117 outputs the stored data of the corresponding data 200 based on the inspection result by the first CRC inspection unit 114.

Figure 4:
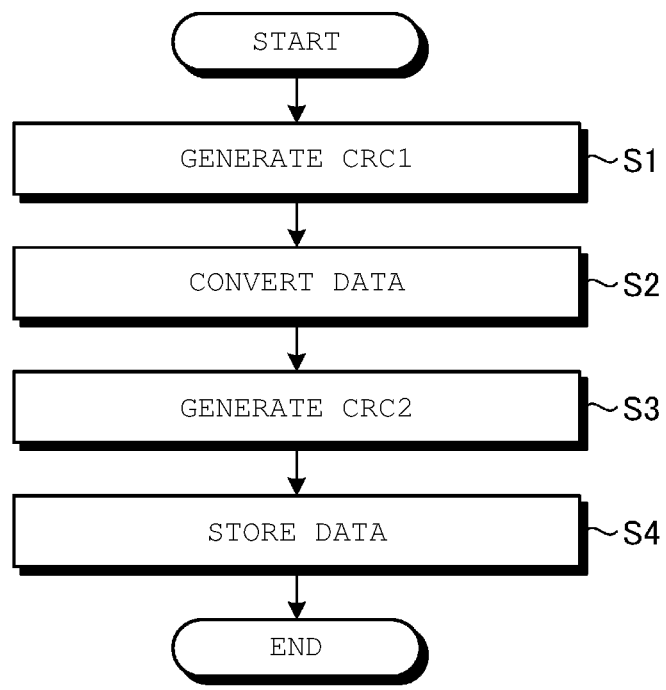
FIG. 4 is a flowchart illustrating a write processing procedure according to the first embodiment.

Subsequently, the procedure of a write processing according to the first embodiment will be described with reference to FIG. 4. FIG. 4 is a flowchart illustrating a write processing procedure according to the first embodiment. First, when a write request is received from the host 2, the first CRC generation unit 111 calculates the CRC1 based on input data (step S1). Here, the input data is, for example, data specified by the write request. Then, the first conversion unit 112 converts the input data (step S2). The second CRC generation unit 113 calculates the CRC2 based on the converted input data (step S3). Then, the corresponding data 200 in which the input data (i.e., stored data), the CRC1, and the CRC2 are associated with each other is stored in the NAND memory 20 (step S4).

Figure 5:
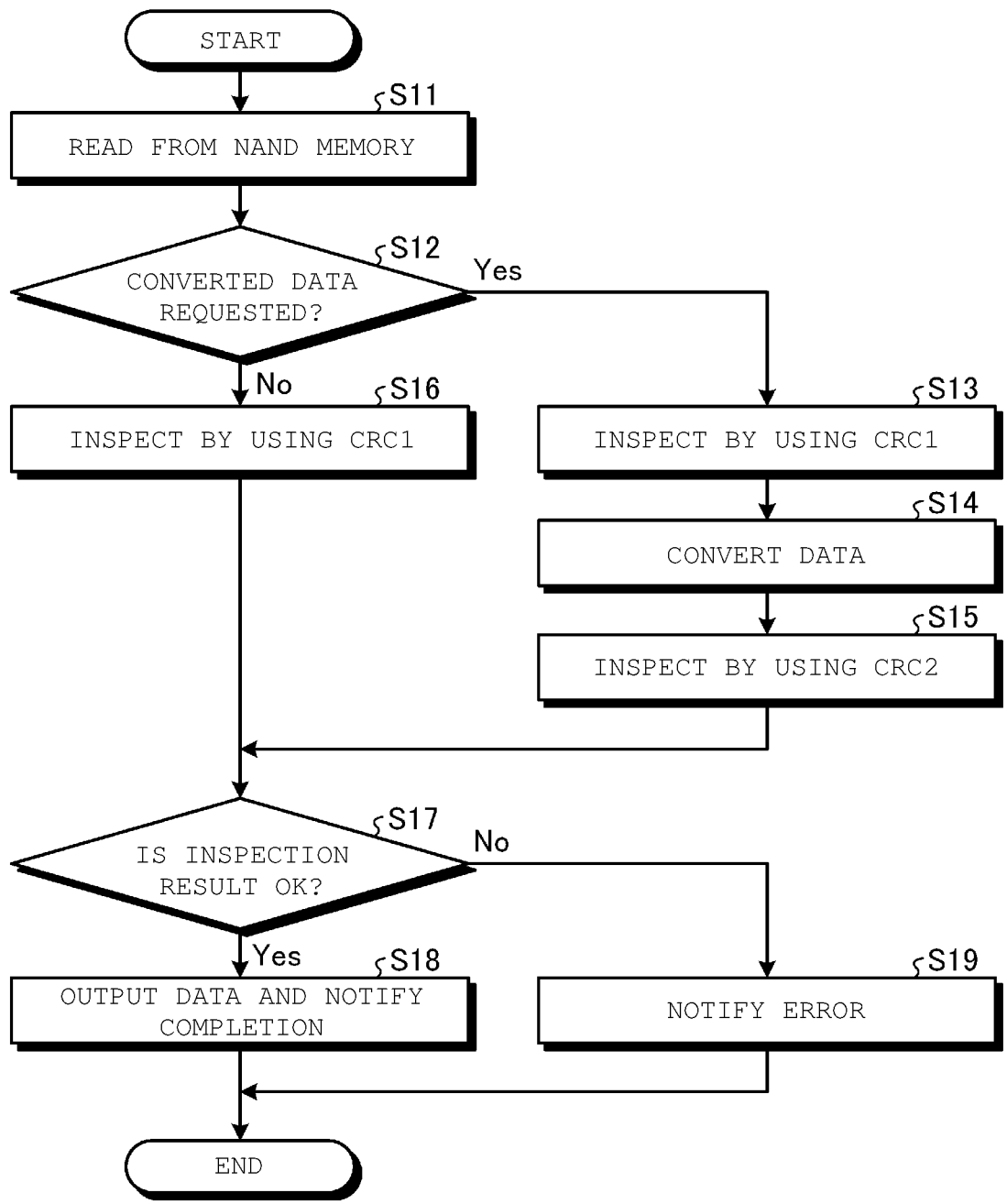
FIG. 5 is a flowchart illustrating a read processing procedure according to the first embodiment.

Subsequently, the procedure of a read processing according to the first embodiment will be described with reference to FIG. 5. FIG. 5 is a flowchart illustrating a read processing procedure according to the first embodiment. When a read request is received from the host 2, the corresponding data 200 is read from the NAND memory 20 (step S11). When the read request is a request to read converted data (step S12: Yes), the first CRC inspection unit 114 acquires the stored data and the CRC 1 of the corresponding data 200, and inspects the stored data of the corresponding data 200 based on the CRC1 (step S13). Further, the second conversion unit 115 acquires the stored data of the corresponding data 200 and the CRC2 of the NAND memory 20, and converts the stored data (step S14). Further, the second CRC inspection unit 116 inspects the converted data based on the CRC2 (step S15).

In step S12, when the read request is not a request to read converted data (step S12: No), the first CRC inspection unit 114 acquires the stored data and the CRC1 of the corresponding data 200, and inspects the stored data of the corresponding data 200 based on the CRC1 (step S16).

In step S17, when the inspection result is appropriate (step S17: Yes), the output unit 117 outputs the stored data and notifies the completion (step S18). Here, the inspection result being appropriate means that the inspection result by the first CRC inspection unit 114 and the inspection result by the second CRC inspection unit 116 do not indicate an error when the read request is a request to read converted data. Further, the inspection result being appropriate means that the inspection result by the first CRC inspection unit 114 does not indicate an error when the read request is not a request to read converted data.

In step S17, when the inspection result is not appropriate (step S17: No), the output unit 117 notifies an error (step S19). Here, the inspection result being not appropriate means that at least one of the inspection result by the first CRC inspection unit 114 and the inspection result by the second CRC inspection unit 116 indicates an error when the read request is a request to read converted data. Further, the inspection result being not appropriate means that the inspection result by the first CRC inspection unit 114 indicates an error when the read request is not a request to read converted data. Further, in step S19, the output unit 117 may not output the stored data, or may output data of a specific value instead of the stored data.

In the memory system 1 according to the first embodiment, the first CRC generation unit 111 calculates the CRC1, the first conversion unit 112 converts the input data, and the second CRC generation unit 113 calculates the CRC2 based on the converted input data. Then, the memory system 1 stores the corresponding data 200 in which the input data (i.e., stored data), the CRC1, and the CRC2 are associated with each other in the NAND memory 20. Further, in the memory system 1, if the stored data is converted when reading the corresponding data 200, the converted data is inspected based on the CRC2.

As described above, in the memory system 1, the CRC2 is calculated based on the converted data before storing the input data in the NAND memory 20. When conversion of the stored data is performed before it is output, failures in the circuit that executes the conversion processing before storing can be appropriately checked by inspecting the converted data based on the CRC2. That is, the memory system 1 can detect a failure in the conversion function even when the stored data is converted before output.

Further, the first conversion unit 112 and the second conversion unit 115 are different circuits. As a result, the second CRC inspection unit 116 can detect that a failure has occurred in the second conversion unit 115 by inspecting the converted data using the CRC2 that is generated based on the input data converted by the first conversion unit 112.

Second Embodiment

Figure 6:
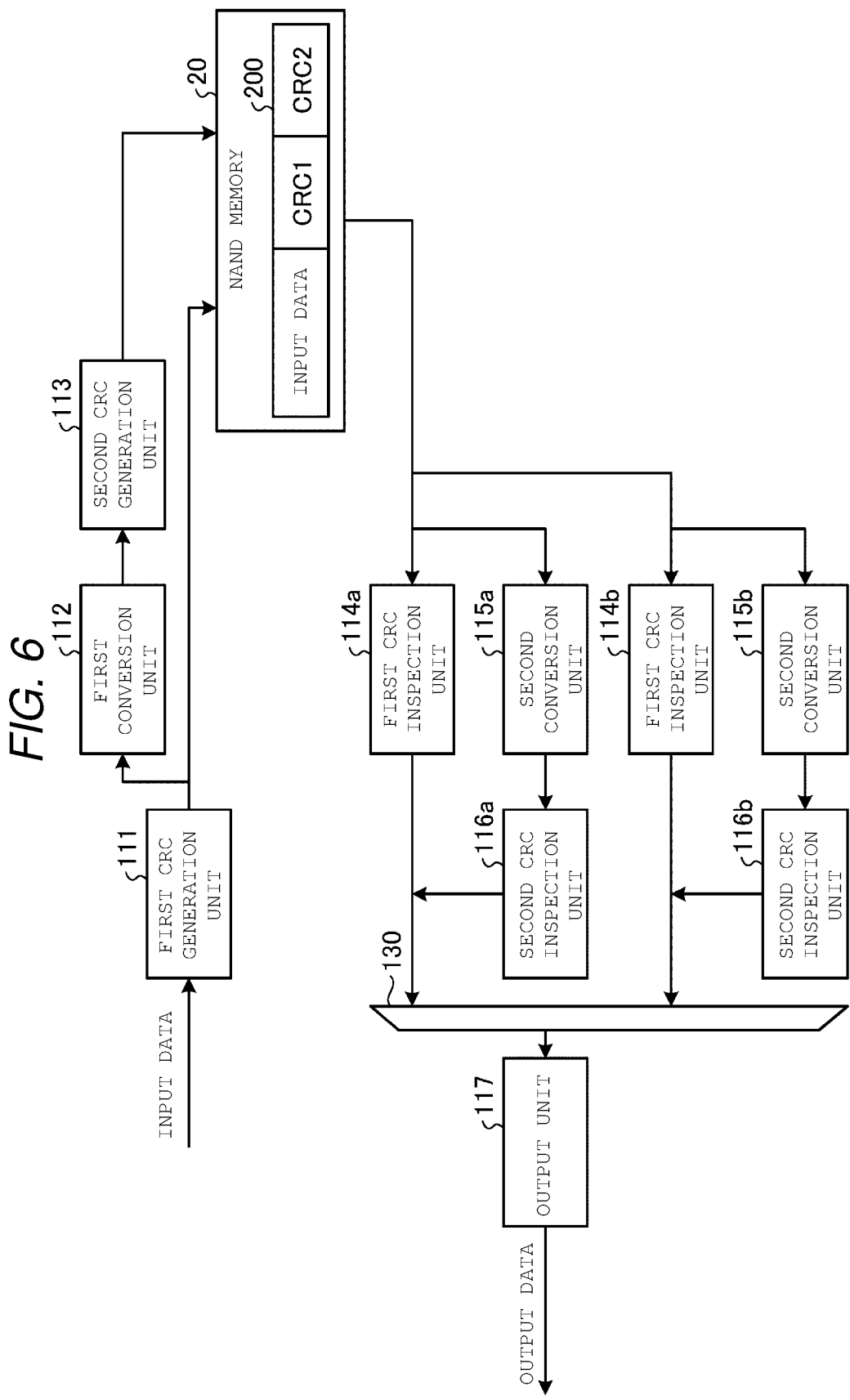
FIG. 6 is a diagram illustrating a functional configuration of a memory system according to a second embodiment.

In the memory system 1 according to a second embodiment, the control unit 11 includes a plurality of the first CRC inspection units 114, a plurality of the second conversion units 115, and a plurality of the second CRC inspection units 116. The write processing and the read processing executed by the memory system 1 according to the second embodiment will be described with reference to FIG. 6. FIG. 6 is a diagram illustrating a functional configuration of the memory system 1 according to the second embodiment. Description on elements common to FIG. 3 will be omitted.

Figure 3:
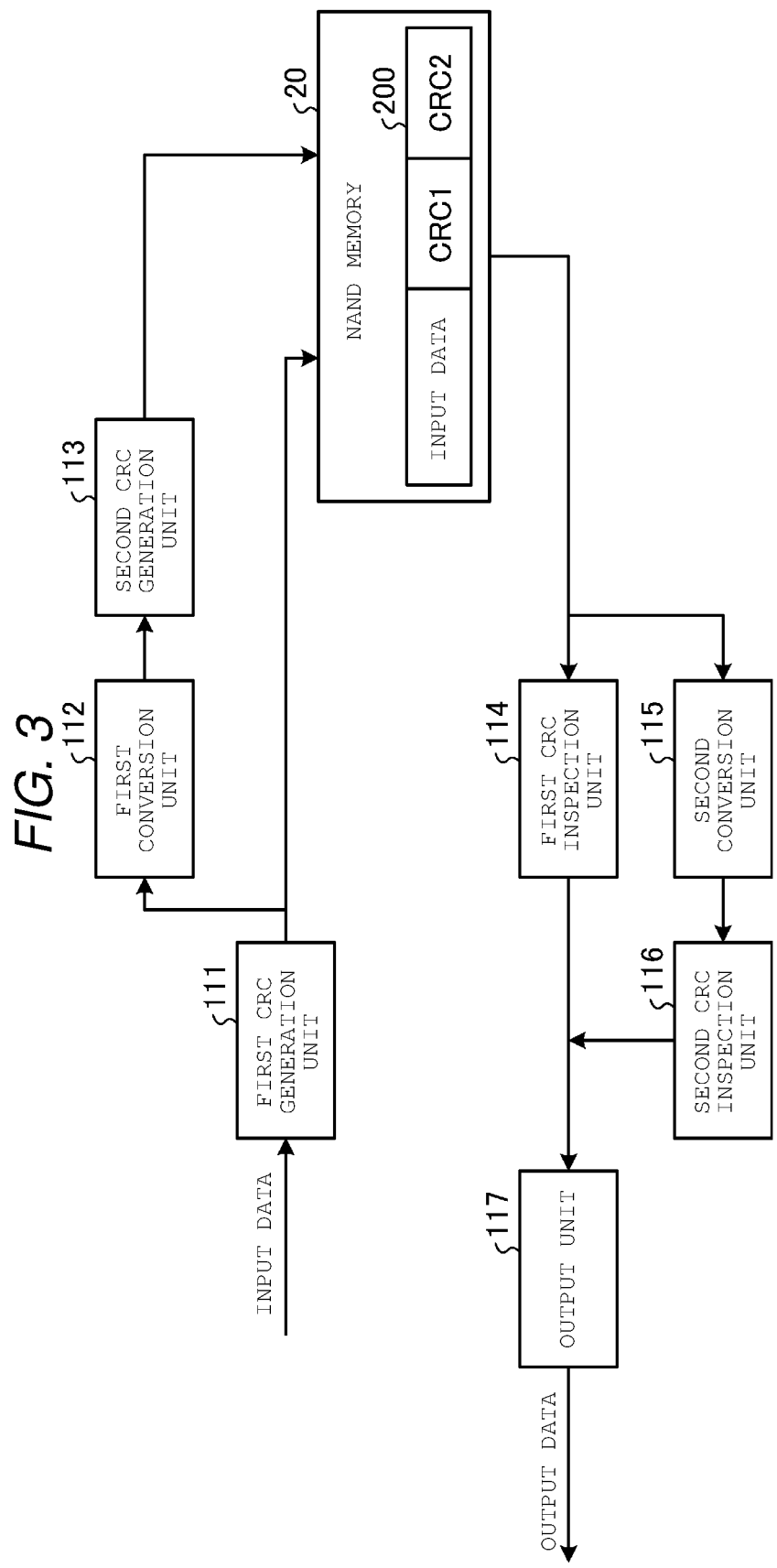
FIG. 3 is a diagram illustrating a functional configuration of the memory system according to the first embodiment.

As illustrated in FIG. 6, similarly to FIG. 3, the control unit 11 in the second embodiment includes the first CRC generation unit 111, the first conversion unit 112, the second CRC generation unit 113, and the output unit 117. Further, the control unit 11 in the second embodiment includes a first CRC inspection unit 114a, a first CRC inspection unit 114b, a second conversion unit 115a, a second conversion unit 115b, a second CRC inspection unit 116a, a second CRC inspection unit 116b, and a multiplexer 130.

First, the write processing is performed in the same manner as in the first embodiment described with reference to FIG. 3. During read processing according to the second embodiment, the corresponding data 200 read from the NAND memory 20 is input to either the first CRC inspection unit 114a and the second conversion unit 115a, or the first CRC inspection unit 114b and the second conversion unit 115b.

The first CRC inspection unit 114a and the second conversion unit 115a output data to the output unit 117 via the multiplexer 130. Further, the first CRC inspection unit 114b and the second conversion unit 115b also output data to the output unit 117 via the multiplexer 130.

The throughput required for the memory system 1 when data is input to the memory system 1 (i.e., write throughput) may differ from the throughput required for the memory system 1 when data is output from the memory system 1 (i.e., read throughput). In particular, the required read throughput tends to be higher than the required write throughput. In the memory system 1 according to the second embodiment, it is possible to improve the read throughput by providing a plurality of the first CRC inspection units 114, a plurality of the second conversion units 115, and a plurality of the second CRC inspection units 116.

Third Embodiment

Figure 7:
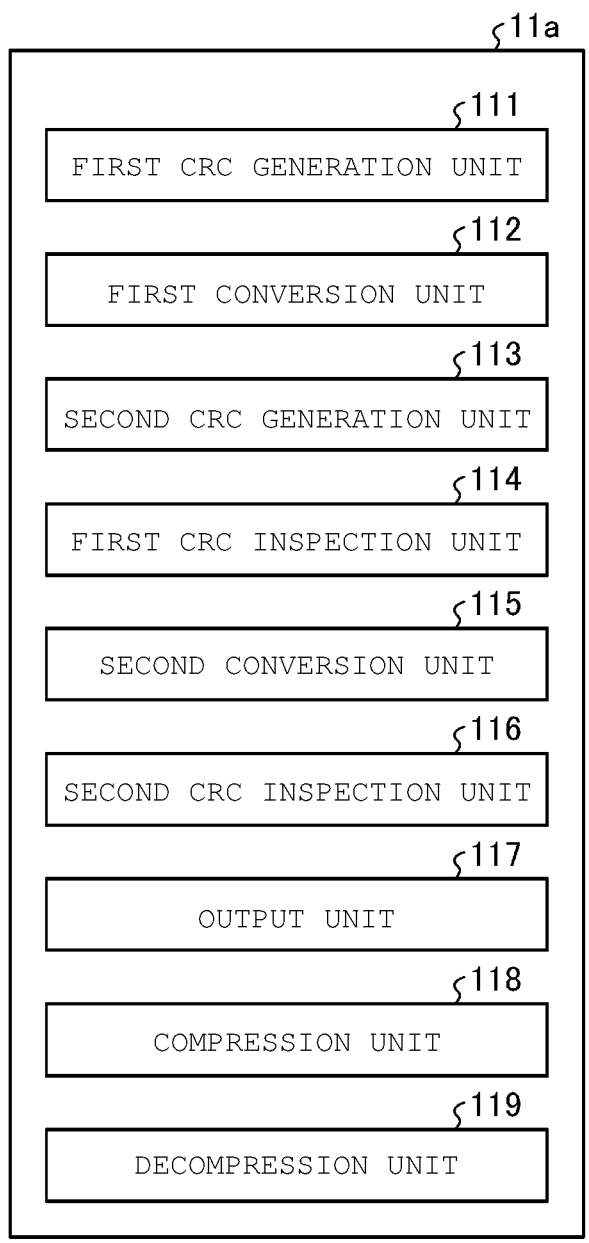
FIG. 7 is a block diagram illustrating an example of a functional configuration of a control unit in a memory system according to a third embodiment.

In the memory system 1 according to a third embodiment, the control unit 11 compresses input data and stores the compressed data in the NAND memory 20. Further, in data output, the control unit 11 converts the stored data in a format different from that of the compression. FIG. 7 is a block diagram illustrating an example of the functional configuration of the control unit 11 in the memory system 1 according to the third embodiment. As illustrated in FIG. 7, the control unit 11a includes the first CRC generation unit 111, the first conversion unit 112, the second CRC generation unit 113, the first CRC inspection unit 114, the second conversion unit 115, the second CRC inspection unit 116, the output unit 117, a compression unit 118, and a decompression unit 119. Description on elements common to FIG. 2 will be omitted.

The compression unit 118 is a circuit that executes compression processing on the input data. The compression unit 118 executes compression processing, for example, in a predetermined compression format set for the memory system 1. The decompression unit 119 is a circuit that executes decompression processing on the data compressed by the compression unit 118.

Figure 8:
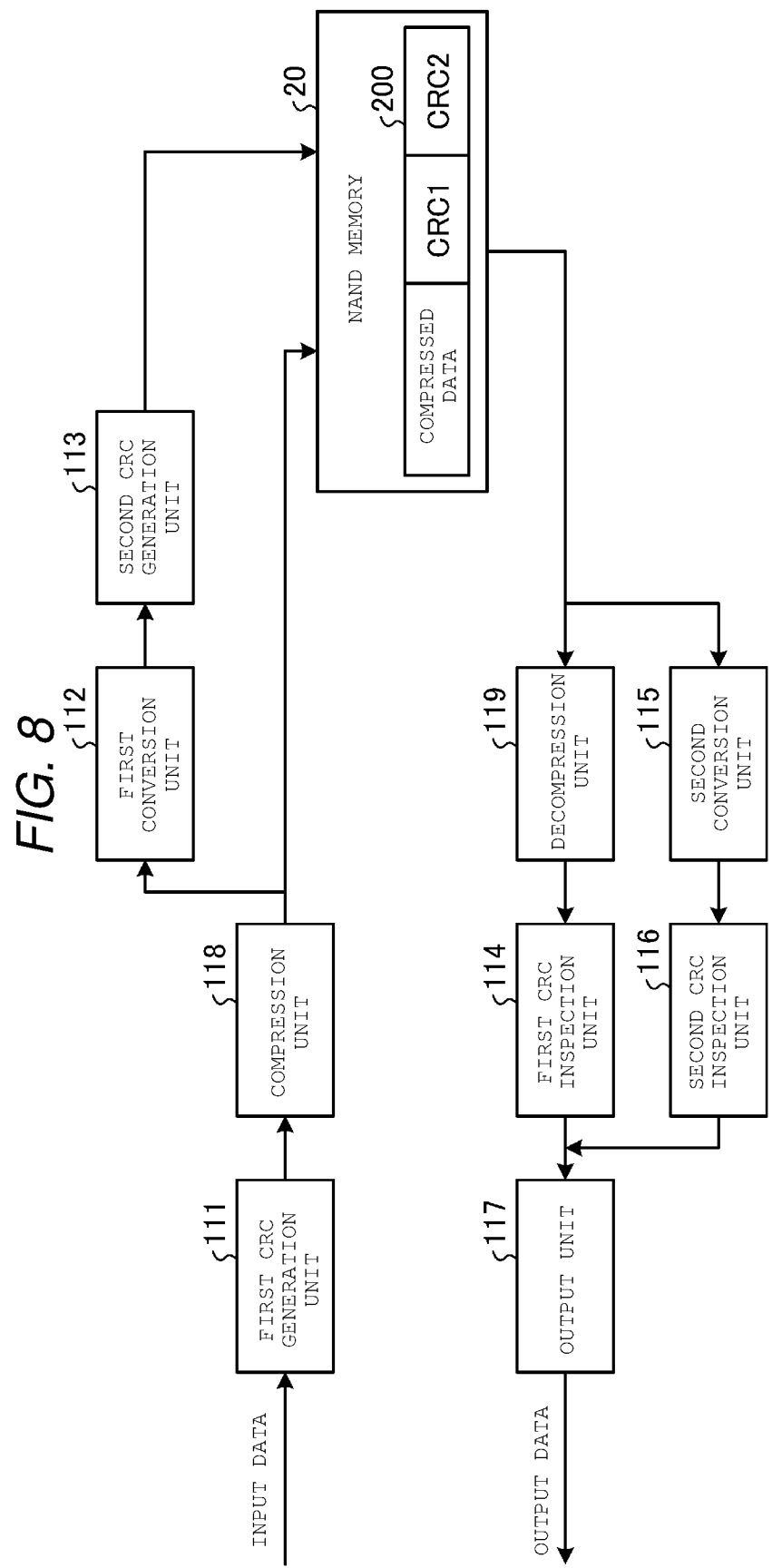
FIG. 8 is a diagram illustrating a functional configuration of a memory system according to the third embodiment.

Subsequently, the write processing and the read processing executed by the memory system 1 according to the third embodiment will be described with reference to the functional configuration of the memory system 1 illustrated in FIG. 8. Description on elements common to FIG. 3 will be omitted. During write processing, after the CRC1 is generated by the first CRC generation unit 111, the compression unit 118 executes compression processing on the input data. The first conversion unit 112 converts the compressed input data, and the second CRC generation unit 113 generates the CRC2 based on the compressed input data. In the NAND memory 20, the corresponding data 200 in which the compressed input data (i.e., compressed data), the CRC1, and the CRC2 are associated with each other is stored.

During read processing, the decompression unit 119 executes decompression processing on the compressed data before inputting data to the first CRC inspection unit 114. Subsequent processing is performed in the same manner as in the first embodiment.

In the memory system 1 according to the third embodiment, the compression unit 118 executes compression processing on the input data, the decompression unit 119 executes decompression processing on the compressed data during read processing, and the first CRC inspection unit 114 inspects the decompressed data based on the CRC1. As a result, even when it is necessary to store the data in the NAND memory 20 in a compressed state, it is possible to detect a failure in a function of converting the stored data.

For example, it is possible that required output formats of data from the memory system 1 are both an uncompressed format and a standard compressed format. In some compression standards, it is more difficult to improve the decompression performance than compression. To address such an issue, the memory system 1 according to the third embodiment may partially change the standard format and stores data in the NAND memory 20 in a format that can be easily decompressed, and converts and outputs the compressed data only when the compressed data is output. As a result, the memory system 1 according to the third embodiment can implement a function of outputting data in a compressed format while reducing the amount of data written to the NAND memory 20.

Fourth Embodiment

In the memory systems 1 according to the first to third embodiments, when outputting converted data, it is necessary to perform inspection using two CRCs to confirm that the memory system 1 has no failure. In particular, when the throughput of the conversion circuit is higher than that of the decompression circuit in the memory system 1 according to the third embodiment, the processing of decompressing the data and inspecting the decompressed data lowers the throughput of the memory system 1. The memory system 1 according to the fourth embodiment performs the inspection based on the stored data in advance.

Figure 9:
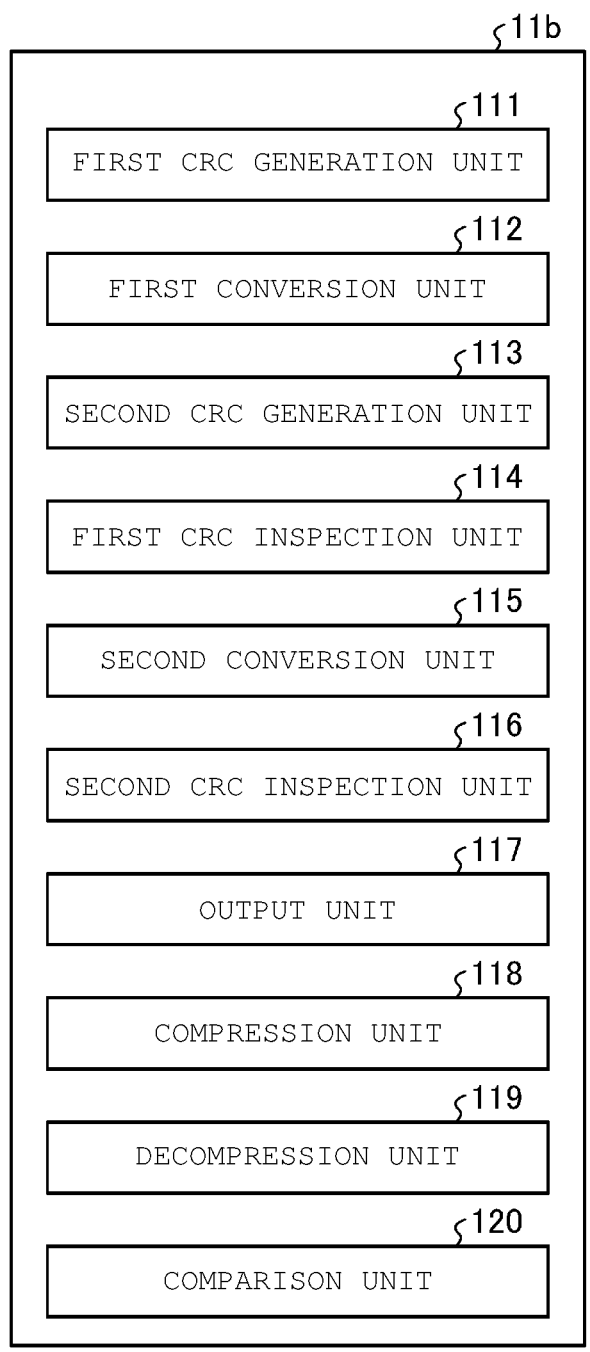
FIG. 9 is a block diagram illustrating an example of a functional configuration of a control unit in a memory system according to a fourth embodiment.

FIG. 9 is a block diagram illustrating an example of the functional configuration of a control unit 11b in the memory system 1 according to the fourth embodiment. As illustrated in FIG. 9, the control unit 11b includes the first CRC generation unit 111, the first conversion unit 112, the second CRC generation unit 113, the first CRC inspection unit 114, the second conversion unit 115, the second CRC inspection unit 116, the output unit 117, the compression unit 118, the decompression unit 119, and a comparison unit 120. Description on elements common to FIGS. 2 and 7 will be omitted.

The comparison unit 120 is a circuit that performs a comparative inspection in which data obtained by decompressing the compressed input data by the decompression unit 119 (specifically, a decompression unit 119a in FIG. 10) is compared with the input data. The comparison unit 120 may inspect data obtained by decompressing the compressed input data by the decompression unit 119 based on the CRC1 calculated by the first CRC generation unit 111.

Figure 10:
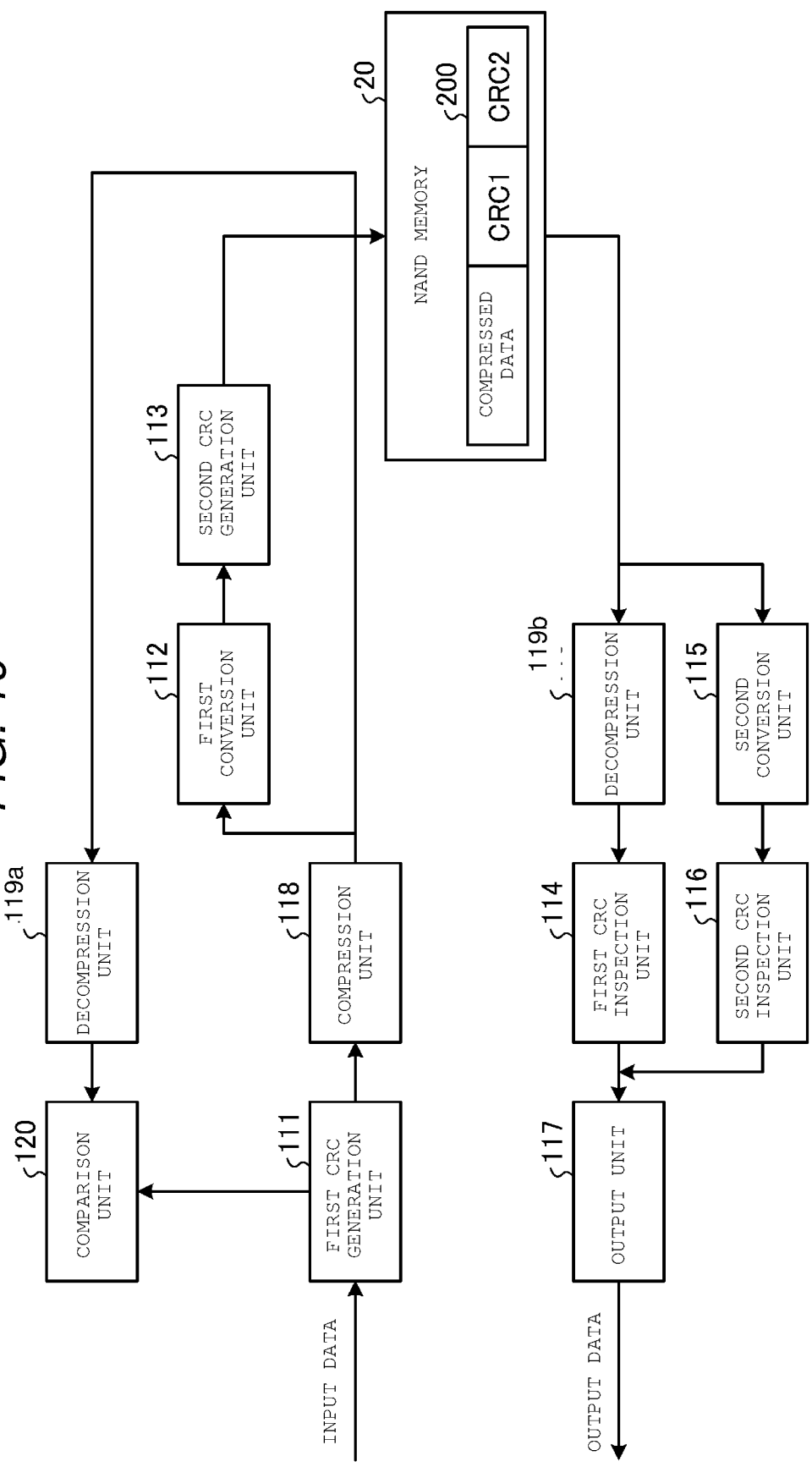
FIG. 10 is a diagram illustrating a functional configuration of a memory system according to the fourth embodiment.

Subsequently, the write processing and the read processing executed by the function of the memory system 1 will be described with reference to the functional configuration of the memory system 1 illustrated in FIG. 10. The description of the parts common to FIGS. 3 and 8 will be omitted. In the write processing, after the CRC1 is generated by the first CRC generation unit 111, the compression unit 118 executes compression processing on the input data. The decompression unit 119a executes decompression processing on the compressed input data. The comparison unit 120 compares the decompressed input data with the input data. As a result of comparing the decompressed input data and the input data, when both pieces of the data match, similarly to the third embodiment, the control unit 11b stores the corresponding data 200 in which the compressed input data (i.e., compressed data), the CRC1, and the CRC2 are associated with each other in the NAND memory 20.

In the read processing, when the compressed data is converted before output, the control unit 11b inspects the converted data based on the CRC2. When the compressed data is decompressed before output, the control unit 11b inspects the decompressed data based on the CRC1.

Figure 11:
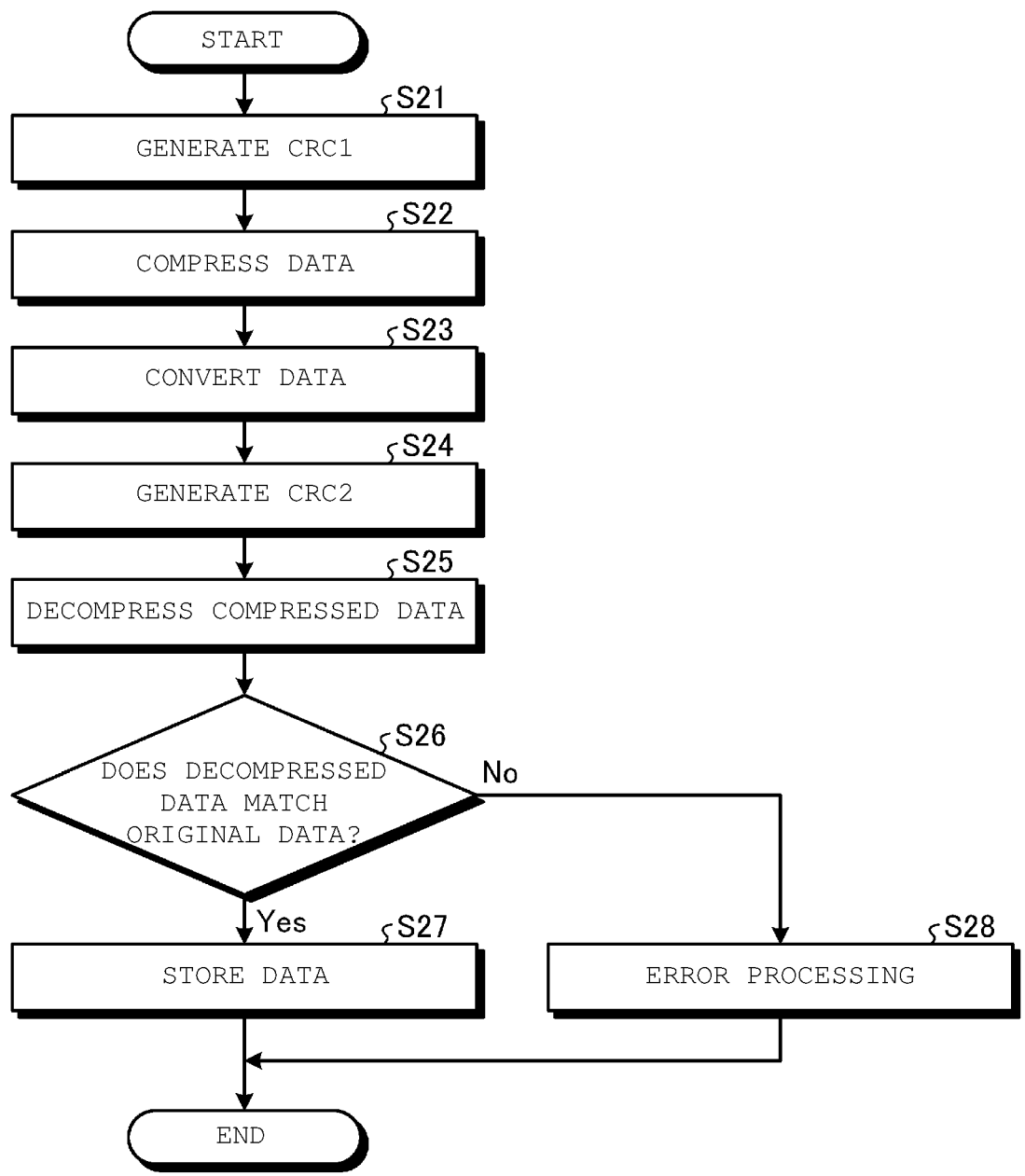
FIG. 11 is a flowchart illustrating a write processing procedure according to the fourth embodiment.

Subsequently, the procedure of the write processing according to the fourth embodiment will be described with reference to FIG. 11. FIG. 11 is a flowchart illustrating a write processing procedure according to the fourth embodiment. First, when a write request is received from the host 2, the first CRC generation unit 111 calculates the CRC1 based on input data (step S21). Here, the input data is, for example, data specified by the write request. Then, the compression unit 118 executes compression processing on the input data (step S22). Then, the first conversion unit 112 converts the compressed input data (step S23). The second CRC generation unit 113 calculates the CRC2 based on the converted data (step S24). The decompression unit 119a executes decompression processing on the compressed input data (step S25). The comparison unit 120 compares the data decompressed by the decompression unit 119a with the input data (step S26).

In step S26, when the data decompressed by the decompression unit 119a and the input data match (step S26: Yes), the corresponding data 200 in which the compressed input data (i.e., compressed data), the CRC1, and the CRC2 are associated with each other is stored in the NAND memory 20 (step S27). In step S26, when the data decompressed by the decompression unit 119 and the input data do not match (step S26: No), error processing is executed (step S28).

Figure 12:
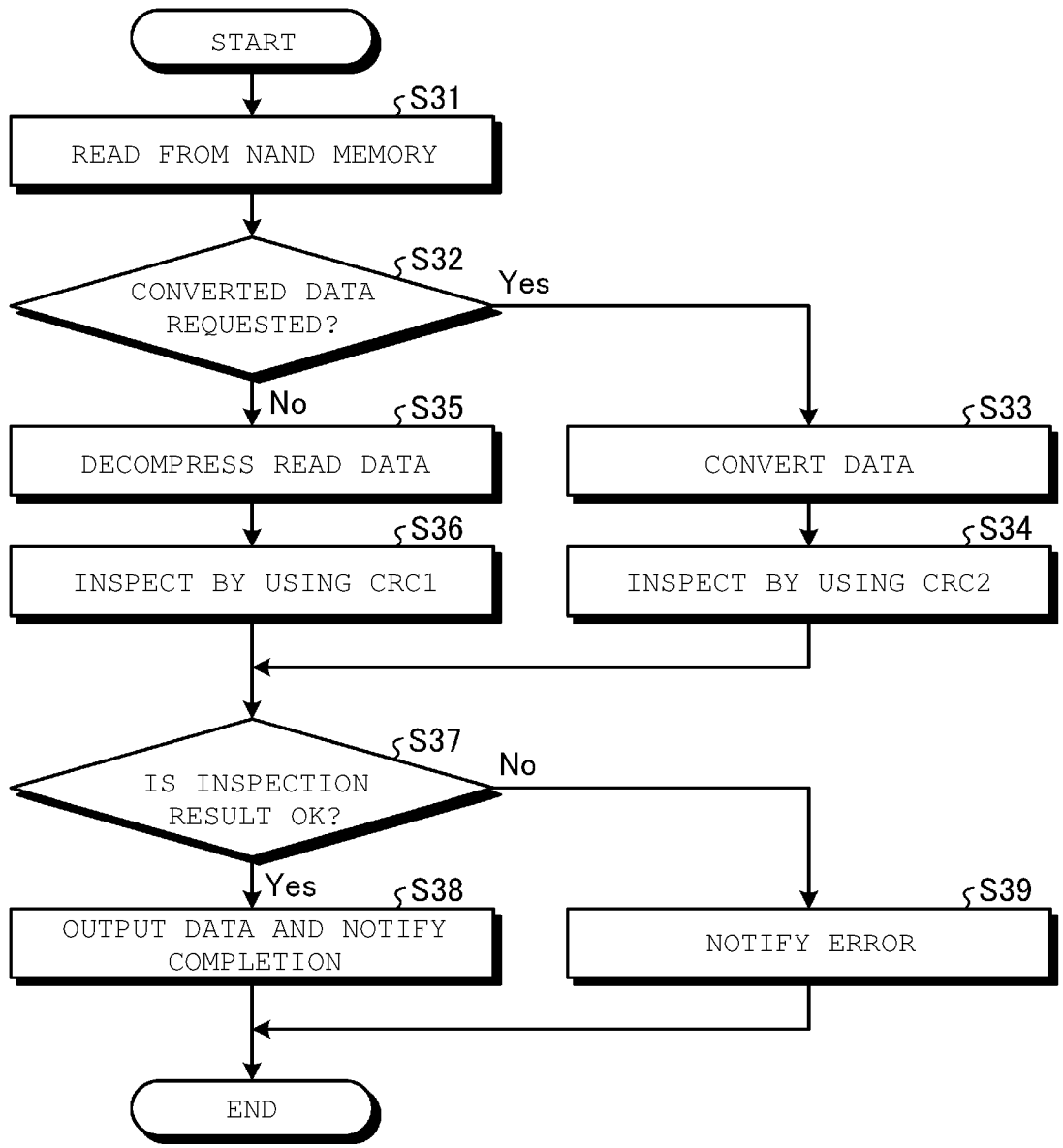
FIG. 12 is a flowchart illustrating a read processing procedure according to the fourth embodiment.

Subsequently, the procedure of the read processing according to the fourth embodiment will be described with reference to FIG. 12. FIG. 12 is a flowchart illustrating a read processing procedure according to the fourth embodiment. When a read request is received from the host 2, the corresponding data 200 is read from the NAND memory 20 (step S31). When the read request is a request to read converted data (step S32: Yes), the second conversion unit 115 acquires the compressed data and the CRC2 of the corresponding data 200 read from the NAND memory 20, and converts the compressed data (step S33). Further, the second CRC inspection unit 116 inspects the converted data based on the CRC2 (step S34).

In step S32, when the read request is not a request to read converted data (step S32: No), a decompression unit 119b (see FIG. 10) executes decompression processing on the compressed data read from the NAND memory 20 (step S35). Then, the first CRC inspection unit 114 acquires the data decompressed by the decompression unit 119 and the CRC1, and inspects the decompressed data based on the CRC1 (step S36).

In step S37, when the inspection result is appropriate (step S37: Yes), the output unit 117 outputs the decompressed data and notifies the completion (step S38). Here, the inspection result being appropriate means that the inspection result by the second CRC inspection unit 116 does not indicate an error when the read request the read request is a request to read converted data. Further, the inspection result being appropriate means that the inspection result by the first CRC inspection unit 114 does not indicate an error when the read request is not a request to read converted data.

In step S37, when the inspection result is not appropriate (step S37: No), the output unit 117 notifies an error (step S39). Here, the inspection result being not appropriate means that the inspection result by the second CRC inspection unit 116 indicates an error when the read request is a request to read converted data. Further, the inspection result being not appropriate means that the inspection result by the first CRC inspection unit 114 indicates an error when the read request is not a request to read converted data. Further, in step S39, the output unit 117 may not output the decompressed or converted data, or may output data of a specific value instead of such data.

In the memory system 1 according to the fourth embodiment, the first conversion unit 112 converts the compressed input data, and the second CRC generation unit 113 calculates the CRC2 based on the converted data. Further, the decompression unit 119a executes decompression processing on the compressed input data, and the comparison unit 120 compares the decompressed input data with the input data. Then, the memory system 1 stores the corresponding data 200 in which the compressed input data (i.e., compressed data), the CRC1, and the CRC2 are associated with each other in the NAND memory 20. Further, in the memory system 1, if the compressed data is converted when reading the corresponding data 200, the converted data is inspected based on CRC2.

As described above, in the memory system 1 according to the fourth embodiment, before storing the compressed input data in the NAND memory 20, the compressed input data is converted and the CRC2 is calculated based on the converted input data, and the decompressed input data is compared with the input data. Then, in the memory system 1, when the compressed data is converted before output, failures in the circuit that executes conversion processing can be appropriately checked by inspecting the converted data based on the CRC2. That is, the memory system 1 according to the fourth embodiment can detect a failure in the conversion function even when the compressed data is converted before output.

Further, in the memory system 1 according to the fourth embodiment, by inspecting the decompressed input data based on the CRC1 during write processing, it is not necessary to inspect the decompressed data after decompression by the decompression unit 119b, and the data output can be efficiently performed.

Modification Example

In the above-described embodiment, the case where the first CRC inspection unit 114 and the second CRC inspection unit 116 are implemented by separate circuits is described, but the first CRC inspection unit 114 and the second CRC inspection unit 116 may be implemented by one circuit.

In this case, the memory system 1 can inspect both the normal data output and the converted data output with one inspection circuit, and can detect a failure in a function closer to the output of the memory system 1.

Further, in the above-described embodiment, the case where CRC is used for data inspection is described. Alternatively, error checking and correcting (ECC) or even-odd parity may be used.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a non-volatile memory; and
   a controller configured to:
   during a writing operation,
   generate a first error detecting code from data that is input;
   perform a predetermined conversion on the data into first conversion data,
   generate a second error detecting code from the first conversion data, and
   store the data, the first error detecting code, and the second error detecting code in the non-volatile memory in association with each other; and during a read operation,
read the data, the first error detecting code, and the second error detecting code from the non-volatile memory;
perform a first error detection on the read data using the read first error detecting code;
perform the predetermined conversion on the read data into second conversion data;
perform a second error detection on the second conversion data using the read second error detecting code; and
output the second conversion data based on results of the first and second error detections.

2. The memory system according to claim 1, wherein the controller includes a first conversion circuit configured to perform the predetermined conversion on the data that is input and a second conversion circuit configured to perform the predetermined conversion on the read data.

3. The memory system according to claim 1, wherein the controller includes a conversion circuit configured to perform the predetermined conversion on the data that is input and the predetermined conversion on the read data.

4. The memory system according to claim 1, wherein the controller does not store the first conversion data in the non-volatile memory during the writing operation.

5. The memory system according to claim 1, wherein the controller is configured to:
perform the read operation in response to a read request; and
perform the predetermined conversion on the read data and the second error detection when the read request requests converted data,
wherein the controller does not perform the predetermined conversion on the read data and the second error detection during the read operation when the read request does not request converted data.

6. The memory system according to claim 1, wherein the controller is configured to, during the read operation:
output the second conversion data upon detecting no error in either the first error detection or the second error detection.

7. The memory system according to claim 6, wherein the controller is configured to, during the read operation:
output an error notification upon detecting an error in either the first error detection or the second error detection.

8. The memory system according to claim 1, wherein the first error detecting code and the second error detecting code are of a same error detecting code type.

9. The memory system according to claim 1, wherein the first error detecting code is a cyclic redundancy check and the second error detecting code is a cyclic redundancy check.

10. The memory system according to claim 1, wherein the predetermined conversion includes at least one of data compression, compression format conversion, and encryption processing.

11. The memory system according to claim 1, wherein the controller includes:
a plurality of first error detection circuits, each of which is configured to perform the first error detection;
a plurality of conversion circuits, each of which is configured to perform the predetermined conversion on the read data; and
a plurality of second detection circuits, each of which is configured to perform the second error detection.

12. A memory system comprising:
a non-volatile memory; and
a controller configured to:
during a writing operation,
generate a first error detecting code from data that is input;
compress the data into compressed data;
perform a predetermined conversion on the compressed data into first conversion data,
generate a second error detecting code from the first conversion data, and
store the compressed data, first error detecting code, and the second error detecting code in the non-volatile memory in association with each other; and
during a read operation,
read the compressed data, first error detecting code, and the second error detecting code from the non-volatile memory;
decompress the read compressed data into decompressed data;
perform a first error detection on the decompressed data using the read first error detecting code;
perform the predetermined conversion on the read compressed data into second conversion data;
perform a second error detection on the second conversion data using the read second error detecting code; and
output the decompressed data based on a result of the first error detection and the second conversion data based on a result of the second error detection.

13. The memory system according to claim 12, wherein the controller includes a first conversion circuit configured to perform the predetermined conversion on the compressed data and a second conversion circuit configured to perform the predetermined conversion on the read compressed data.

14. The memory system according to claim 12, wherein the controller includes a conversion circuit configured to perform the predetermined conversion on the compressed data and the predetermined conversion on the read compressed data.

15. The memory system according to claim 12, wherein the first conversion data is not stored in the non-volatile memory during the writing operation.

16. The memory system according to claim 12, wherein the controller is configured to:
perform the read operation in response to a read request;
perform the predetermined conversion on the read compressed data and the second error detection when the read request requests converted data; and
perform decompression of the read compressed data and the first error detection when the read request does not request converted data.

17. The memory system according to claim 16, wherein
the controller does not perform the predetermined conversion on the read compressed data and the second error detection when the read request does not request converted data; and
the controller does not perform the decompression of the read compressed data and the first error detection when the read request requests converted data.

18. The memory system according to claim 16, wherein the controller is configured to, during the read operation:
output the decompressed data upon detecting no error in the first error detection and the second conversion data upon detecting no error in the second error detection.

19. The memory system according to claim 12, wherein the controller is configured to, during the write operation:

decompress the compressed data into decompressed data; and compare the data that is input with the decompressed data generated during the write operation.

20. The memory system according to claim 12, wherein the predetermined conversion is different from the compression of the data that is input.

* * * * *